United States Patent
Baek et al.

(10) Patent No.: US 9,564,194 B1
(45) Date of Patent: Feb. 7, 2017

(54) INPUT APPARATUS AND SEMICONDUCTOR MEMORY APPARATUS HAVING THE INPUT APPARATUS

(71) Applicant: SK hynix Inc., Icheon-si, Gyeonggi-do (KR)

(72) Inventors: Seung Geun Baek, Icheon-si (KR); Jae Il Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/139,840

(22) Filed: Apr. 27, 2016

(30) Foreign Application Priority Data

Mar. 11, 2016 (KR) .................. 10-2016-0029467

(51) Int. Cl.
| G11C 7/22 | (2006.01) |
| G11C 8/06 | (2006.01) |
| G11C 7/10 | (2006.01) |
| G11C 8/10 | (2006.01) |
| G11C 8/18 | (2006.01) |

(52) U.S. Cl.
CPC .............. *G11C 8/06* (2013.01); *G11C 7/109* (2013.01); *G11C 7/1063* (2013.01); *G11C 7/22* (2013.01); *G11C 7/222* (2013.01); *G11C 8/10* (2013.01); *G11C 8/18* (2013.01)

(58) Field of Classification Search
CPC ..................................... G11C 7/22; G11C 8/18
USPC ............................................. 365/191, 233.5
See application file for complete search history.

(56) References Cited

U.S. PATENT DOCUMENTS

| 4,739,404 | A | * | 4/1988 | Richardson | .......... | B23K 9/0956 |
| | | | | | | 348/719 |
| 6,301,678 | B1 | * | 10/2001 | Sato | ................. | G11C 29/48 |
| | | | | | | 714/718 |
| 7,028,120 | B2 | * | 4/2006 | Hu | ................. | G06F 13/14 |
| | | | | | | 710/24 |
| 2008/0266924 | A1 | * | 10/2008 | Abedifard | ............... | G11C 8/04 |
| | | | | | | 365/51 |
| 2012/0311371 | A1 | * | 12/2012 | Shaeffer | ........... | G06F 13/1694 |
| | | | | | | 713/501 |
| 2015/0310916 | A1 | * | 10/2015 | Leem | ............. | G06F 12/0246 |
| | | | | | | 711/103 |

FOREIGN PATENT DOCUMENTS

| KR | 100432886 B1 | 5/2004 |
| KR | 1020070082107 A | 8/2007 |

* cited by examiner

*Primary Examiner* — Michael Tran
(74) *Attorney, Agent, or Firm* — William Park & Associates Ltd.

(57) ABSTRACT

An input apparatus of a semiconductor memory may be provided. The input apparatus may include a first storage circuit configured to receive at least a portion of an input signal provided based on a pin reduction command which is enabled before an operation command through a pin and store the at least a portion of the input signal. The input apparatus may include a second storage circuit configured to receive a remaining portion of the input signal provided based on the operation command through the pin and store the remaining portion of the input signal. The input apparatus may include an arrangement circuit configured to control an output timing of the input signal stored in the first storage circuit and the second storage circuit.

20 Claims, 7 Drawing Sheets

INPUT APPARATUS AND SEMICONDUCTOR MEMORY APPARATUS HAVING THE INPUT APPARATUS

CROSS-REFERENCES TO RELATED APPLICATION

This application claims priority under 35 U.S.C. 119(a) to Korean application No. 10-2016-0029467, filed on Mar. 11, 2016, in the Korean intellectual property Office, which is incorporated by reference in its entirety as set forth in full.

BACKGROUND

1. Technical Field

Various embodiments may generally relate to a semiconductor integrated circuit device, and more particularly, to an input apparatus and a semiconductor memory apparatus having the input apparatus.

2. Related Art

In general, after semiconductor memory apparatuses are fabricated on a wafer, the chips may be tested through a wafer test process before the chips are individualized to determine whether or not there is a failure. The test process may also be performed at a packaging level after the chips fabricated on the wafer are individualized.

Because the test process is performed at the packaging level, the test process at the wafer level may tend to be simplified, and thus only the minimum number of pins may be used in the wafer test process.

Due to a reduction in the number of test pins at the wafer test, fabrication costs associated with a probe card may be saved and a test parameter may be reduced.

An address, data, and the like required for the test operation may have to be input within a preset time. For example, n/m input pins may be necessary to input n signals for m clock cycles.

When more signals are input using less input pins within a preset clock cycle, the pin reduction efficiency can be expected to increase at the wafer test performed within the pin reduction mode.

SUMMARY

According to an embodiment, an input apparatus of a semiconductor memory may be provided. The input apparatus may include a first storage circuit configured to receive at least a portion of an input signal provided based on a pin reduction command which is enabled before an operation command received through a pin and store the at least a portion of the input signal. The input apparatus may include a second storage circuit configured to receive a remaining portion of the input signal provided based on the operation command received through the pin and store the remaining portion of the input signal. The input apparatus may include an arrangement circuit configured to control an output timing of the input signal stored in the first storage circuit and the second storage circuit.

According to an embodiment, an input method of a semiconductor memory may be provided. The input method may include receiving at least a portion of an input signal provided based on a pin reduction command which is enabled before an operation command received through a plurality of pins and storing the at least a portion of the input signal in a first storage circuit. The input method may include receiving a remaining portion of the input signal provided based on the operation command received through the plurality of pins and storing the remaining portion of the input signal in a second storage circuit. The input method may include outputting output signals of the first storage circuit and the second storage circuit at the same timing.

According to an embodiment, a semiconductor memory apparatus may be provided. The semiconductor memory apparatus may include a memory region including a plurality of memory cells. The semiconductor memory apparatus may include an address decoder configured to select a memory cell to be accessed. The semiconductor memory apparatus may include an input apparatus which may be configured to include a first storage circuit configured to receive at least a portion of an input signal provided based on a pin reduction command which is enabled before an operation command received through a pin and store the at least a portion of the input signal. The semiconductor memory apparatus may include an input apparatus which may be configured to include a second storage circuit configured to receive a remaining portion of the input signal provided based on the operation command received through the pin and store the remaining portion of the input signal. The semiconductor memory apparatus may include an input apparatus which may be configured to include an arrangement circuit configured to provide the input signal to the address decoder by controlling output timings of the at least a portion and the remaining portion of the input signal.

DETAILED DESCRIPTION

Figure 1:
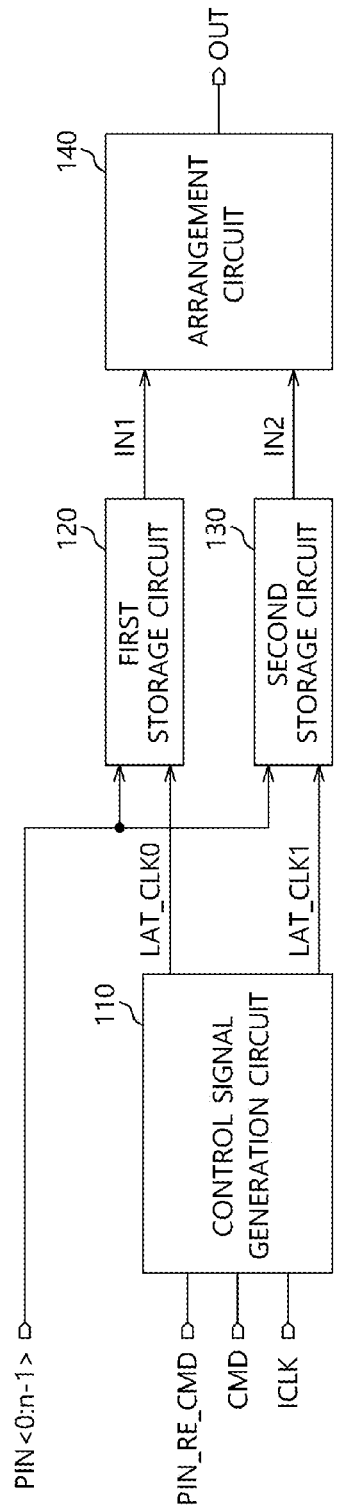
FIG. 1 is a configuration diagram illustrating an example of a representation of an input apparatus of a semiconductor memory according to an embodiment.

Examples of embodiments will be described in greater detail with reference to the accompanying drawings. Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The concepts described herein may be discussed with reference to cross-section and/or plan illustrations according to various embodiments. However, the embodiments should not be construed as limiting. Although a few embodiments will be illustrated and described, it will be appreciated by those of ordinary skill in the art that changes may be made in these examples of embodiments without departing from the principles and spirit of the disclosure.

FIG. 1 is a configuration diagram illustrating an example of a representation of an input apparatus of a semiconductor memory according to an embodiment.

Referring to FIG. 1, an input apparatus 10 of a semiconductor memory according to an embodiment may include a control signal generation circuit 110, a first storage circuit 120, a second storage circuit 130, and an arrangement circuit 140.

The control signal generation circuit 110 may be configured to generate latch signals LAT_CLK0 and LAT_CLK1 in response to a pin reduction enable signal PIN_REDUC which is generated according to a pin reduction command PIN_RE_CMD and an operation command CMD and an internal clock ICLK which is generated by buffering an external clock ECLK.

The first storage circuit 120 may be configured to receive at least a portion PIN<0:(n/2)−1> (not illustrated) of an input signal PIN<0:n−1> which is provided together with the pin reduction command PIN_RE_CMD through a plurality of pins and store the portion of the input signal as a first input signal IN1 in response to a first latch signal LAT_CLK0.

The second storage circuit 130 may be configured to receive a remaining portion PIN<(n/2): n−1> (not illustrated) of the input signal PIN<0: n−1> which is provided together with the operation command CMD through a plurality of pins and store the remaining portion of the input signal as a second input signal IN2 in response to a second latch signal LAT_CLK1.

In an embodiment, the operation command CMD may be enabled after the pin reduction command PIN_RE_CMD is enabled. The portion PIN<0:(n/2)−1> of the input signal and the remaining portion PIN<(n/2):n−1> of the input signal may be provided through the same pin set. The number of pins which the portion PIN<0:(n/2)−1> and the remaining portion PIN<(n/2):n−1> of the input signal are input therethrough may be determined based on the total bit number n of the input signal and a pin reduction rate. For example, when the total bit number n of the input signal is 10 and the pin reduction rate is 2, five (=10/2) input pins may be necessary.

In an embodiment, a portion PIN<0:4> of the input signal may be provided to the first storage circuit 120 through five pins together with the pin reduction command PIN_RE_CMD, and the first storage circuit 120 may store the portion PIN<0:4> of the input signal as the first input signal IN1 in response to the first latch signal LAT_CLK0. A remaining portion PIN<5:9> of the input signal may be provided to the second storage circuit 130 through the five pins, which the portion PIN<0:4> of the input signal is provided therethrough, together with the operation command CMD, and the second storage circuit 130 may store the remaining portion PIN<5:9> of the input signal as the second input signal IN2 in response to the second latch signal LAT_CLK1.

The arrangement circuit 140 may be configured to generate an output signal OUT by controlling an output timing of the first input signal IN1 stored in the first storage circuit 120 and an output timing of the second input signal IN2 stored in the second storage circuit 130. In an embodiment, the arrangement circuit 140 may control the first input signal IN1 and the second input signal IN2 to be output as the output signal OUT with the same timing, at the same time, substantially with the same timing, or substantially at the same time in response to the internal clock ICLK. In an embodiment, the arrangement circuit 140 may be configured to generate the output signal OUT by outputting the first input signal IN1 and the second input signal IN2 with the same timing, at the same time, substantially with the same timing, or substantially at the same time in parallel and serializing the first input signal IN1 and the second input signal IN2.

The arrangement circuit 140 may be configured to generate the output signal OUT in synchronization with a rising edge or a falling edge of the internal clock ICLK generated just after the timing that the at least a portion of the input signal is stored in the first storage circuit 120 and the remaining portion of the input signal is stored in the second storage circuit 130.

In an embodiment, the operation command CMD may be provided in synchronization with a specific cycle of the external clock ECLK. The pin reduction command PIN_RE_CMD may be provided in synchronization with the external clock ECLK before at least one cycle of the specific cycle.

The portion PIN<0:(n/2)−1> of the input signal may be provided in synchronization with a rising edge and/or a falling edge of the external clock ECLK. In an embodiment, the portion PIN<0: (n/2)−1> of the input signal may be provided in synchronization with the rising edge and/or the falling edge of the external clock ECLK which the pin reduction command PIN_RE_CMD is synchronized therewith. The remaining portion PIN<(n/2): n−1> of the input signal may be provided in synchronization with the rising edge and/or the falling edge of the external clock ECLK. In an embodiment, the remaining portion PIN<(n/2): n−1> of the input signal may be provided in synchronization with the rising edge and/or the falling edge of the external clock ECLK which the operation command CMD is synchronized therewith.

In an embodiment, the pin reduction enable signal PIN_REDUC may be generated according to the pin reduction command PIN_RE_CMD and the operation command CMD. In an embodiment, the pin reduction enable signal PIN_REDUC may be generated to be enabled in response to the pin reduction command PIN_RE_CMD and disabled in response to the operation command CMD.

The first storage circuit 120 may store the portion PIN<0: (n/2)−1> of the input signal in synchronization with an enabling timing of the pin reduction enable signal PIN_REDUC. The second storage circuit 130 may store the remaining portion PIN<(n/2):n−1> of the input signal in synchronization with a disabling timing of the pin reduction enable signal PIN_REDUC.

According to the technology, the portion PIN<0: (n/2)−1> of the input signal may be input in synchronization with the pin reduction command PIN_RE_CMD which is enabled before the command CMD is enabled, and the remaining portion PIN<(n/2):n−1> of the input signal may be input in response to the operation command CMD. The first storage circuit 120 and the second storage circuit 130 may store the portion PIN<0: (n/2)−1> and the remaining portion PIN<(n/2):n−1> of the input signal as the first input signal IN1 and the second input signal IN2 in response to the pin reduction enable signal PIN_REDUC which is generated based on the pin reduction command PIN_RE_CMD and the operation command CMD. The arrangement circuit 140 may control the first input signal IN1 and the second input signal IN2 to be output with the same timing, at the same time, substantially with the same timing, or substantially at the same time in response to the internal clock ICLK which is in synchronization with the timing of the operation command CMD being disabled.

That is, the input apparatus 10 may previously input the portion PIN<0:(n/2)−1> of the input signal through a plurality of pins before the operation command CMD is enabled and may input the remaining portion PIN<(n/2): n−1> of the input signal through the same pins when the operation command CMD is enabled.

The input apparatus 10 may provide the input signal PIN<0:n−1> using the minimum number of pins by dividing the input signal PIN<0:n−1> by a preset pin reduction rate and inputting the divided input signals in the wafer test process.

Figure 2:
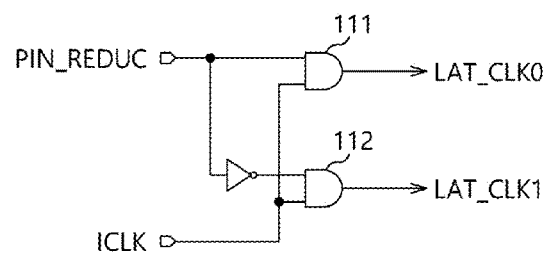
FIG. 2 is a configuration diagram illustrating an example of a representation of a control signal generation circuit according to an embodiment.

FIG. 2 is a configuration diagram illustrating an example of a representation of a control signal generation circuit according to an embodiment.

Referring to FIG. 2, the control signal generation circuit 110 may include a first latch signal generator 111 and a second latch signal generator 112.

The first latch signal generator 111 may be configured to generate the first latch signal LAT_CLK0 in response to the pin reduction enable signal PIN_REDUC and the internal clock ICLK. The first latch signal generator 111 may be configured to enable the first latch signal LAT_CLK0 when the internal clock ICLK is enabled and the pin reduction enable signal PIN_REDUC is enabled.

The second latch signal generator 112 may be configured to generate the second latch signal LAT_CLK1 in response to an inverting signal of the pin reduction enable signal PIN_REDUC and the internal clock ICLK. The second latch signal generator 112 may be configured to enable the second latch signal LAT_CLK1 when the internal clock ICLK is enabled and the pin reduction enable signal PIN_REDUC is transitioned from an enable state to a disable state.

Accordingly, after the first latch signal LAT_CLK0 is enabled and then the portion PIN<0:(n/2)−1> of the input signal is stored in the first storage circuit 120, the second latch signal LAT_CLK1 may be enabled. When the second latch signal LAT_CLK1 is enabled, the remaining portion PIN<(n/2): n−1> of the input signal may be stored in the second storage circuit 130.

Figure 3:
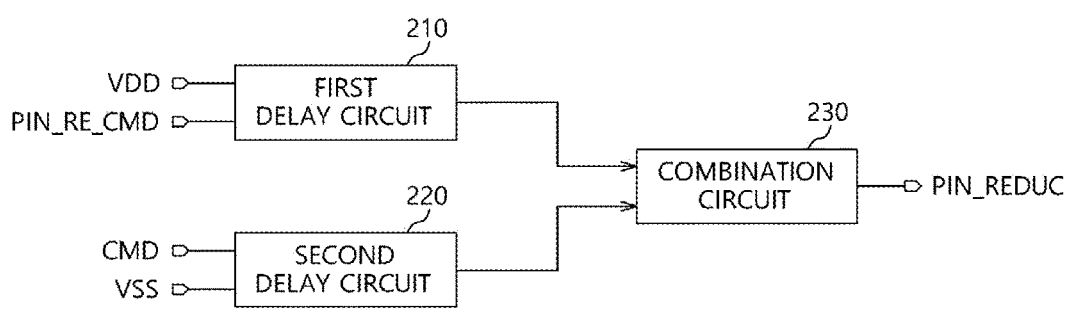
FIG. 3 is a configuration diagram illustrating an example of a representation of a pin reduction enable signal generation circuit according to an embodiment.

FIG. 3 is a configuration diagram illustrating an example of a representation of a pin reduction enable signal generation circuit according to an embodiment.

Referring to FIG. 3, a pin reduction enable signal generation circuit 20 may include a first delay circuit 210, a second delay circuit 220, and a combination circuit 230.

The first delay circuit 210 may receive a power voltage VDD and may receive the pin reduction command PIN_RE_CMD, delay the received pin reduction command PIN_RE_CMD by a preset time, and output the delayed pin reduction command. The second delay circuit 220 may receive a ground voltage VSS and may receive the operation command CMD, delay the operation command CMD by a preset time, and output the delayed operation command.

The combination circuit 230 may be configured to generate the pin reduction enable signal PIN_REDUC by receiving output signals of the first delay circuit 210 and the second delay circuit 220. In an embodiment, the combination circuit 230 may generate the pin reduction enable signal PIN_REDUC which is enabled at an enable timing of the pin reduction command PIN_RE_CMD and disabled at an enabling timing of the operation command CMD.

In an embodiment, the pin reduction enable signal PIN_REDUC may be generated based on the pin reduction command PIN_RE_CMD and the operation command CMD as described above. However, the pin reduction enable signal PIN_REDUC may be directly input through addition of a specific pin.

Figure 4:
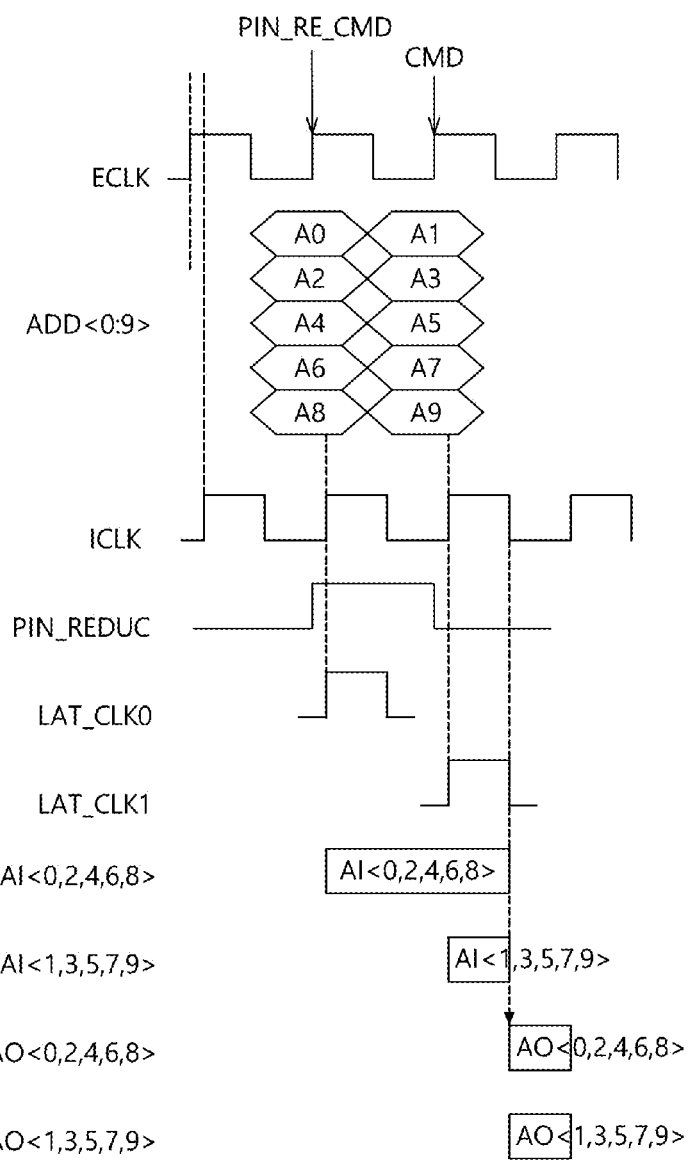
FIG. 4 is a timing diagram for explaining an example of an input method of a semiconductor memory according to an embodiment.

FIG. 4 is a timing diagram for explaining an example of an input method of a semiconductor memory according to an embodiment.

An example implementing a 10-bit address signal ADD<0:9> is input at a pin reduction rate of 2 is used as an example and is illustrated in FIG. 4.

The pin reduction command PIN_RE_CMD may be enabled in synchronization with the rising edge of the external clock ECLK before one cycle of the external clock ELCK at a specific timing when the operation command CMD is synchronized, and a portion of the input signal, that is, a portion ADD<0,2,4,6,8> of an address signal ADD<0:9> may be provided through first to fifth pins together with the pin reduction command PIN_RE_CMD.

The internal clock ICLK may be generated by buffering the external clock ECLK, and the pin reduction enable signal PIN_REDUC may be generated based on the operation command CMD and the pin reduction command PIN_RE_CMD.

As the pin reduction enable signal PIN_REDUC is enabled, the first latch signal LAT_CLK0 may be enabled, and a portion AI<0,2,4,6,8> of the address signal may be stored in the first storage circuit 120.

A remaining portion of the input signal, that is, a remaining portion ADD<1,3,5,7,9> of the address signal ADD<0:9> may be provided through the same pin set, that is, the first to fifth pins together with the operation command CMD. As the operation command CMD is enabled, the pin reduction enable signal PIN_REDUC may be disabled, and the second latch signal LAT_CLK1 may be enabled. Accordingly, a remaining portion AI<1,3,5,7,9> of the address signal may be stored in the second storage circuit 130.

The arrangement circuit 140 may output a portion AO<0,2,4,6,8> and a remaining portion AO<1,3,5,7,9> of the address signal with the same timing, at the same time, substantially with the same timing, or substantially at the same time in response to the falling edge of the internal clock ICLK which is synchronized with the timing that the operation command CMD is disabled.

Figure 5:
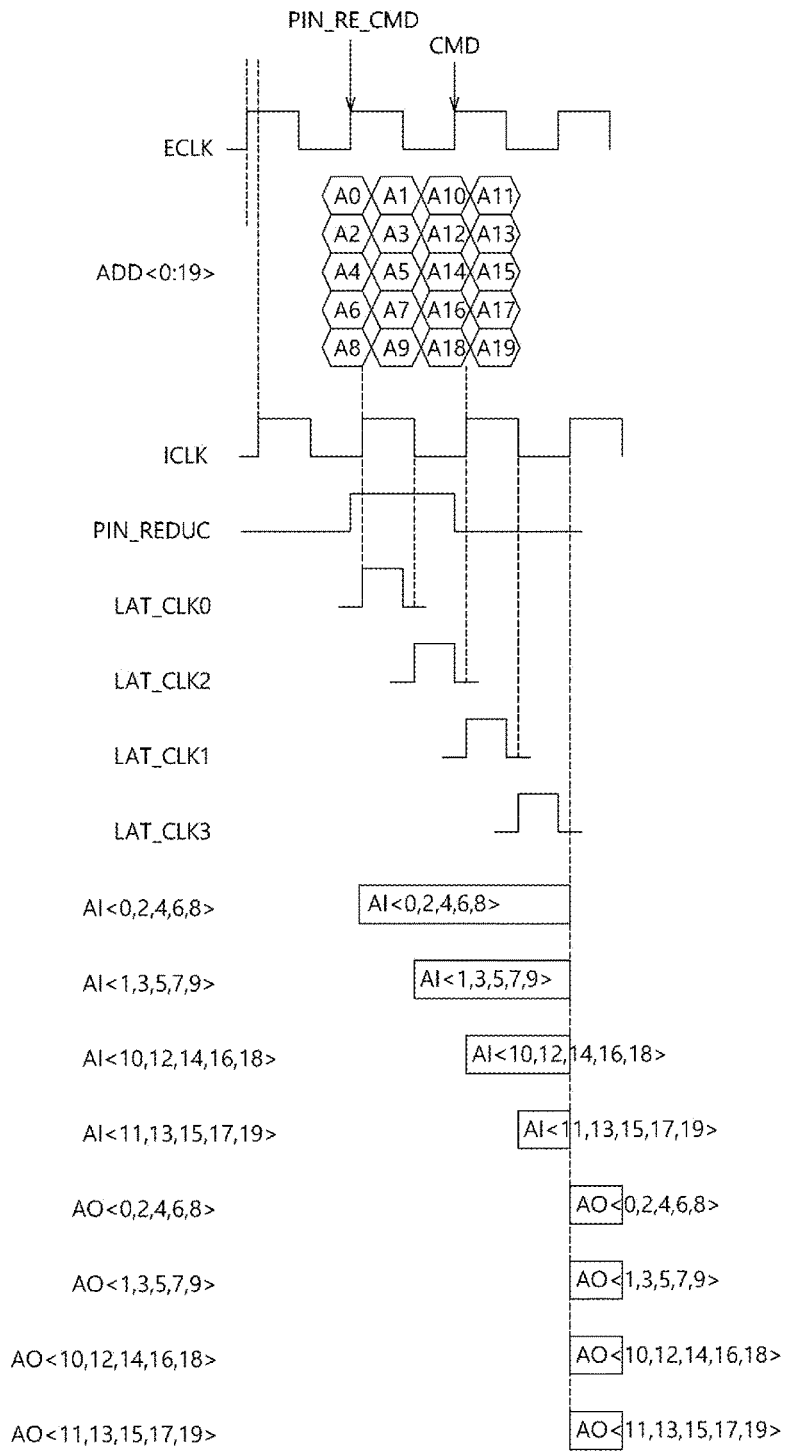
FIG. 5 is a timing diagram for explaining an example of an input method of a semiconductor memory according to an embodiment.

FIG. 5 is a timing diagram for explaining an example of an input method of a semiconductor memory according to an embodiment.

FIG. 5 illustrates an operation timing diagram of an input apparatus when a pin reduction rate is, for example, 4. The input apparatus may provide the input signal PIN<0:n> in synchronization with both a rising edge and a falling edge of the external clock ECLK. It should be obvious that the number of storage circuits is corresponding to the pin reduction rate.

An example implementing a 20-bit address signal ADD<0:19> is input at a pin reduction rate of 4 is used as an example and is illustrated in FIG. 5. The address signal ADD<0:19> may be divided into first to fourth groups ADD<0,2,4,6,8>, ADD<1,3,5,7,9>, ADD<10,12,14,16,18>, and ADD<11,13,15,17,19> and may be sequentially input through the same pin set.

The pin reduction command PIN_RE_CMD may be enabled in synchronization with a rising edge of the external clock ECLK before one cycle of the external clock ELCK at a specific timing when the operation command CMD is synchronized, and the first group of the input signal, that is, the first group of address signal ADD<0,2,4,6,8> may be provided through first to fifth pins together with the pin reduction command PIN_RE_CMD. The second group of the input signal, that is, the second group of address signal ADD<1,3,5,7,9> may be provided through the first to fifth pins in synchronization with the falling edge of the external clock ECLK at the timing that the pin reduction command PIN_RE_CMD is synchronized. The third group of address signal ADD<10,12,14,16,18> may be provided through the first to fifth pins in synchronization with the rising edge of the external clock ECLK which the operation command CMD provided next to the pin reduction command PIN_RE_CMD is synchronized therewith. The fourth group of address signal ADD<11,13,15,17,19> may be provided through the first to fifth pins in synchronization with the falling edge of the external clock ECLK at the timing that the operation command CMD is synchronized.

The internal clock ICLK may be generated by buffering the external clock ECLK, and the pin reduction enable signal PIN_REDUC may be generated based on the operation command CMD and the pin reduction command PIN_RE_CMD.

First to fourth storage circuits (not illustrated) may be provided to store the first to fourth address groups. The first to fourth storage circuits may be configured to store the input address in synchronization with the rising edge and the falling edge of the internal clock ICLK generated based on the external clock ECLK which the pin reduction command PIN_RE_CMD is synchronized therewith and the rising edge and the falling edge of the internal clock ICLK generated based on the external clock ECLK which the operation command CMD is synchronized therewith.

That is, the first storage circuit may store a first group of address signal AI<0,2,4,6,8> in response to the first latch signal LAT_CLK0 enabled at the rising edge of the internal clock ICLK generated based on the external clock ECLK which the pin reduction command PIN_RE_CMD is synchronized therewith. The third storage circuit may store a second group of address signal AI<1,3,5,7,9> in response to the third latch signal LAT_CLK2 enabled at the falling edge of the internal clock ICLK generated based on the external clock ECLK which the pin reduction command PIN_RE_CMD is synchronized therewith. The second storage circuit may store a third group of address signal AI<10,12,14,16,18> in response to the second latch signal LAT_CLK1 enabled at the rising edge of the internal clock ICLK generated based on the external clock ECLK which the operation command CMD is synchronized therewith. The fourth storage circuit may store a fourth group of address signal AI<11,13,15,17,19> in response to the fourth latch signal LAT_CLK3 enabled at the falling edge of the internal clock ICLK generated based on the external clock ECLK which the operation command CMD is synchronized therewith.

Then, the first group of address signal to the fourth group of address signal AO<0,2,4,6,8>, AO<1,3,5,7,9>, AO<10,12,14,16,18>, and AO<11,13,15,17,19> may be output with the same timing, at the same time, substantially with the same timing, or substantially at the same time in response to the internal clock ICLK enabled after the operation command CMD is disabled.

Figure 6:
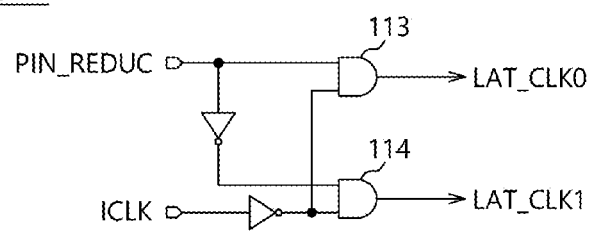
FIG. 6 is a configuration diagram illustrating an example of a representation of a control signal generation circuit according to an embodiment.

FIG. 6 is a configuration diagram illustrating an example of a representation of a control signal generation circuit according to an embodiment.

The control signal generation circuit 110 illustrated in FIG. 2 may generate the first and second latch signals LAT_CLK0 and LAT_CLK1 in synchronization with the rising edges of the pin reduction enable signal PIN_REDUC and the internal clock ICLK.

A control signal generation circuit 110-1 illustrated in FIG. 6 may generate the first and second latch signals LAT_CLK0 and LAT_CLK1 in synchronization with the falling edge of the internal clock ICLK to store the portion and the remaining portion of the input signal in the storage circuits.

Referring to FIG. 6, a third latch signal generator 113 may generate the first latch signal LAT_CLK0 based on the pin reduction enable signal PIN_REDUC and an inverting signal of the internal clock ICLK.

That is, the third latch signal generator 113 may be configured to enable the first latch signal LAT_CLK0 when the internal clock ICLK is disabled and the pin reduction enable signal PIN_REDUC is enabled.

A fourth latch signal generator 114 may generate the second latch signal LAT_CLK1 based on an inverting signal of the pin reduction enable signal PIN_REDUC and the inverting signal of the internal clock ICLK. That is, the fourth latch signal generator 114 may be configured to enable the second latch signal LAT_CLK2 when the internal clock ICLK is disabled and the pin reduction enable signal PIN_REDUC is transitioning from an enable state to a disable state.

As described above, the number of storage circuits corresponding to the pin reduction rate may be necessary. As described with relation to FIG. 5, when the pin reduction rate is 4, four storage circuits may be necessary and the first to fourth latch signals LAT_CLK0, LAT_CLK1, LAT_CLK2, and LAT_CLK3 may be necessary to sequentially drive the storage circuits.

Figure 7:
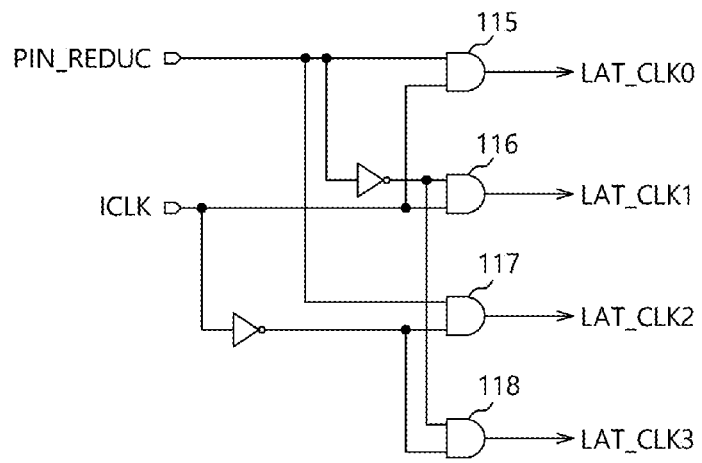
FIG. 7 is a configuration diagram illustrating an example of a representation of a control signal generation circuit according to an embodiment.

FIG. 7 is a configuration diagram illustrating an example of a representation of a control signal generation circuit according to an embodiment.

Referring to FIG. 7, a control signal generation circuit 110-2 may include a first latch signal generator 115, a second latch signal generator 116, a third latch signal generator 117, and a fourth latch signal generator 118.

The first latch signal generator 115 may be configured to generate the first latch signal LAT_CLK0 in response to the pin reduction enable signal PIN_REDUC and the internal clock ICLK. The first latch signal generator 115 may be configured to enable the first latch signal LAT_CLK0 when the internal clock ICLK is enabled and the pin reduction enable signal PIN_REDUC is enabled.

The second latch signal generator 116 may be configured to generate the second latch signal LAT_CLK1 in response to an inverting signal of the pin reduction enable signal PIN_REDUC and the internal clock ICLK. The second latch signal generator 116 may be configured to enable the second latch signal LAT_CLK1 when the internal clock ICLK is enabled and the pin reduction enable signal PIN_REDUC is transitioning from an enable state to a disable state.

The third latch signal generator 117 may be configured to generate the third latch signal LAT_CLK2 based on the pin reduction enable signal PIN_REDUC and an inverting signal of the internal clock ICLK. The third latch signal generator 117 may be configured to enable the third latch signal LAT_CLK2 when the internal clock ICLK is disabled and the pin reduction enable signal PIN_REDUC is enabled.

The fourth latch signal generator 118 may be configured to generate the fourth latch signal LAT_CLK3 based on the inverting signal of the pin reduction enable signal PIN_REDUC and the inverting signal of the internal clock ICLK. The fourth latch signal generator 118 may be configured to enable the fourth latch signal LAT_CLK3 when the internal clock ICLK is disabled and the pin reduction enable signal PIN_REDUC is transit from an enable state to a disable state.

The configurations of the control signal generation circuits 110, 110-1, and 110-2 are not limited thereto, and any configuration which generates a plurality of latch signals in synchronization with the internal clock ICLK and the pin reduction enable signal PIN_REDUC may be adapted to the control signal generation circuit.

Figure 8:
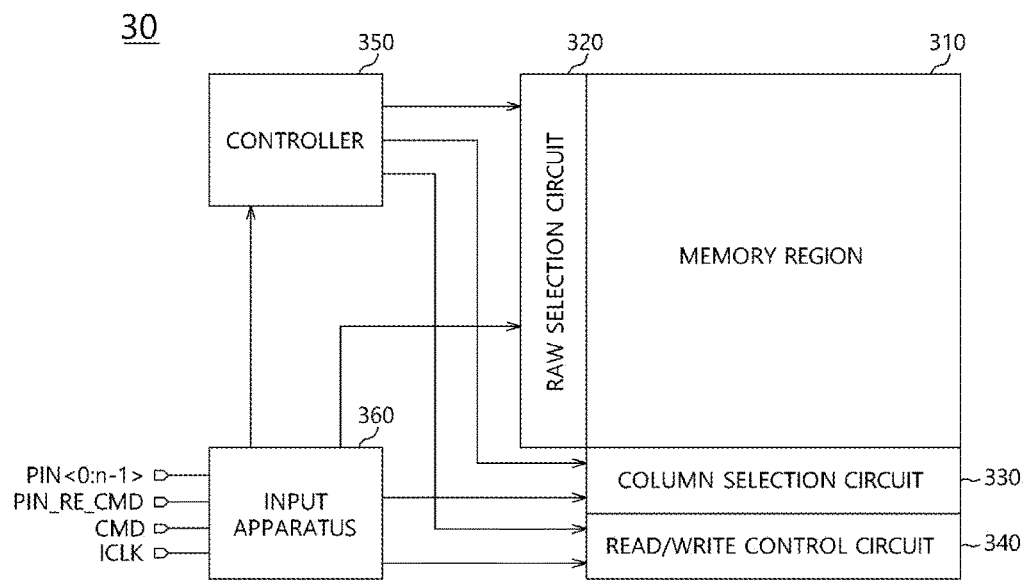
FIG. 8 is a configuration diagram illustrating an example of a representation of a semiconductor memory apparatus according to an embodiment.

FIG. 8 is a configuration diagram illustrating an example of a representation of a semiconductor memory apparatus according to an embodiment.

Referring to FIG. 8, a semiconductor memory apparatus 30 according to an embodiment may include a memory region 310, a row selection circuit 320, a column selection circuit 330, a read/write control circuit 340, a controller 350, and an input apparatus 360.

The memory region 310 may be configured in such a manner that memory cells coupled between word lines and bit lines are arranged in an array form. The memory cell may be a volatile memory cell or a nonvolatile memory cell. In an embodiment, the memory cell may be a multilevel cell which stores two pieces of data or more. In an embodiment, the memory region 310 may have a cross point structure or a stack cell structure.

The row selection circuit 320 and the column selection circuit 330 may include address decoders and may receive external address signals. The row selection circuit 320 and the column selection circuit 330 may decode a row address and a column address of a memory cell to be accessed in the memory region 310, that is, a word line address and a bit line address of the memory cell according to control of the controller 350.

In an embodiment, the row selection circuit 320 and the column selection circuit 330 may receive address signals provided through the input apparatus 360.

The read/write control circuit 340 may include a write circuit configured to receive data from a data input/output (I/O) circuit block (not illustrated) and write the data in the memory region 310 through control of the controller 350 and a read circuit configured to provide data read from a selected memory cell of the memory region 310 to the data I/O circuit block through control of the controller 350.

The controller 350 may control the row selection circuit 320, the column selection circuit 330, and the read/write control circuit 340 to write data in the memory region 310 in response to a write command input from an external apparatus or a host. The controller 350 may control the row selection circuit 320, the column selection circuit 330, and the read/write control circuit 340 to read data from the memory region 310 in response to a read command input from the external apparatus or the host.

An input signal such as an address signal may be provided through the input apparatus 360 in a wafer test mode or a normal operation mode of the semiconductor memory apparatus 30.

The input apparatus 360 may be configured to receive the portion PIN<0:(n/2)−1> of the input signal provided together with the pin reduction command PIN_RE_CMD through a plurality of pins and store the portion of the input signal, to receive the remaining portion PIN<(n/2):n−1> of the input signal provided together with the operation command CMD enabled after the pin reduction command PIN_RE_CMD through a plurality of pins and store the remaining portion of the input signal, and to output the input signal by controlling the output timings of the portion and the remaining portion of the input signal in response to the internal clock CLK.

The input apparatus 360 may be the input apparatuses described and illustrated in FIG. 1 to 3, 6, or 7.

Accordingly, the semiconductor apparatus 30 may receive and store the portion of the input signal before the operation command CMD is enabled and receive and store the remaining portion of the input signal when the operation command CMD is enabled. The semiconductor memory apparatus 30 may simultaneously output the portion and the remaining portion of the input signal when the operation command CMD is disabled or after the operation command CMD is disabled.

When an n-bit input signal is input, the number of pins required to input the input signal may be reduced according to the pin reduction rate.

Figure 9:
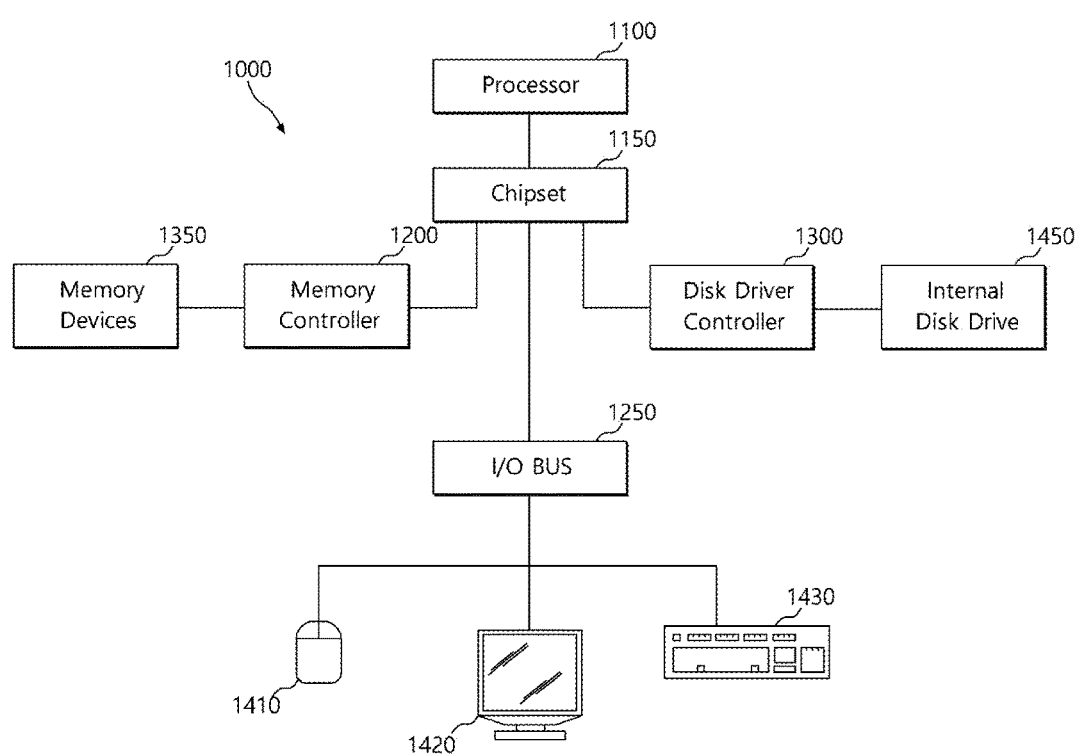
FIG. 9 illustrates a block diagram of an example of a representation of a system employing an input apparatus and or semiconductor memory apparatus with the various embodiments discussed above with relation to FIGS. 1-8.

The input apparatuses and or semiconductor memory apparatuses as discussed above (see FIGS. 1-8) are particular useful in the design of memory devices, processors, and computer systems. For example, referring to FIG. 9, a block diagram of a system employing a input apparatus and or semiconductor memory apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one input apparatus and or semiconductor memory apparatus as discussed above with reference to FIGS. 1-8. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one input apparatus and or semiconductor memory apparatus as discussed above with relation to FIGS. 1-8, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 9 is merely one example of a input apparatus and or semiconductor memory apparatus as discussed above with relation to FIGS. 1-8. In alternate embodiments, such as, for example but not limited to, cellular phones or digital cameras, the components may differ from the embodiments illustrated in FIG. 9.

The above embodiments are illustrative and not limitative. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. An input apparatus of a semiconductor memory comprising:
    a first storage circuit configured to receive at least a portion of an input signal provided based on a pin reduction command which is enabled before an operation command received through a pin and store the at least a portion of the input signal;
    a second storage circuit configured to receive a remaining portion of the input signal provided based on the operation command received through the pin and store the remaining portion of the input signal; and
    an arrangement circuit configured to control an output timing of the input signal stored in the first storage circuit and the second storage circuit.

2. The input apparatus of claim 1, wherein the first storage circuit and the second storage circuit are configured to store the input signal based on a pin reduction enable signal which is generated based on the pin reduction command and the operation command.

3. The input apparatus of claim 2, wherein the first storage circuit is configured to store the at least a portion of the input signal in synchronization with a rising edge and/or a falling edge of an internal clock based on the enablement of the pin reduction enable signal.

4. The input apparatus of claim 2, wherein the second storage circuit is configured to store the remaining portion of the input signal in synchronization with a rising edge and/or a falling edge of an internal clock based on the disablement of the pin reduction enable signal.

5. The input apparatus of claim 1, wherein the operation command is configured to be provided in synchronization with a specific cycle of an external clock and the pin reduction command is configured to be provided in synchronization with the external clock before at least one cycle of the specific cycle.

6. The input apparatus of claim 1, wherein the at least a portion of the input signal is configured to be provided in synchronization with a rising edge and/or a falling edge of an external clock.

7. The input apparatus of claim 1, wherein the remaining portion of the input signal is configured to be provided in synchronization with a rising edge and/or a falling edge of an external clock.

8. The input apparatus of claim 1, wherein the arrangement circuit is configured to output the at least a portion of the input signal stored in the first storage circuit and the remaining portion of the input signal stored in the second storage circuit at substantially the same time.

9. The input apparatus of claim 1, wherein the arrangement circuit is configured to output the input signal as an output signal in synchronization with a rising edge or a falling edge of an internal clock generated just after a timing that the at least a portion of the input signal is stored in the first storage circuit and the remaining portion of the input signal is stored in the second storage circuit.

10. The input apparatus of claim 1, wherein a number of pins is determined based on the number of bits of the input signal and a pin reduction rate.

11. The input apparatus of claim 1, wherein a number of storage circuits including the first and second storage circuits corresponds to a pin reduction rate.

12. A semiconductor memory apparatus comprising:
    a memory region including a plurality of memory cells;
    an address decoder configured to select a memory cell to be accessed; and
    an input apparatus which is configured to include:
        a first storage circuit configured to receive at least a portion of an input signal provided based on a pin reduction command which is enabled before an operation command received through a pin and store the at least a portion of the input signal;
        a second storage circuit configured to receive a remaining portion of the input signal provided based on the operation command received through the pin and store the remaining portion of the input signal; and
        an arrangement circuit configured to provide the input signal to the address decoder by controlling output timings of the at least a portion and the remaining portion of the input signal.

13. The semiconductor memory apparatus of claim 12, wherein the first storage circuit and the second storage circuit are configured to store the input signal based on a pin reduction enable signal which is generated based on the pin reduction command and the operation command.

14. The semiconductor memory apparatus of claim 13, wherein the first storage circuit is configured to store the at least a portion of the input signal in synchronization with a rising edge and/or a falling edge of an internal clock based on the enablement of the pin reduction enable signal.

15. The semiconductor memory apparatus of claim 13, wherein the second storage circuit is configured to store the remaining portion of the input signal in synchronization with a rising edge and/or a falling edge of an internal clock based on the disablement of the pin reduction enable signal.

16. The semiconductor memory apparatus of claim 12, wherein the operation command is configured to be provided in synchronization with a specific cycle of an external clock and the pin reduction command is configured to be provided in synchronization with the external clock before at least one cycle of the specific cycle.

17. The semiconductor memory apparatus of claim 12, wherein the at least a portion of the input signal is configured to be provided in synchronization with a rising edge and/or a falling edge of an external clock.

18. The input apparatus of claim 12, wherein the remaining portion of the input signal is configured to be provided in synchronization with a rising edge and/or a falling edge of an external clock.

19. The semiconductor memory apparatus of claim 12, wherein the arrangement circuit is configured to output the at least a portion of the input signal stored in the first storage circuit and the remaining portion of the input signal stored in the second storage circuit at substantially the same time.

20. The semiconductor apparatus of claim 12, wherein the arrangement circuit is configured to output the input signal as an output signal in synchronization with a rising edge or a falling edge of an internal clock generated just after a timing that the at least a portion of the input signal is stored in the first storage circuit and the remaining portion of the input signal is stored in the second storage circuit.

* * * * *